United States Patent
Kobayashi et al.

(10) Patent No.: US 7,023,947 B2
(45) Date of Patent: Apr. 4, 2006

(54) DATA REPRODUCTION APPARATUS

(75) Inventors: Hideki Kobayashi, Tsurugashima (JP); Hiroki Kuribayashi, Tsurugashima (JP)

(73) Assignee: Pioneer Corporation, Tokyo-To (JP)

( * ) Notice: Subject to any disclaimer, the term of this patent is extended or adjusted under 35 U.S.C. 154(b) by 683 days.

(21) Appl. No.: 10/057,183

(22) Filed: Jan. 23, 2002

(65) Prior Publication Data

US 2002/0097823 A1    Jul. 25, 2002

(30) Foreign Application Priority Data

Jan. 25, 2001    (JP)    ............................. P2001-017534

(51) Int. Cl.
*H03D 3/24*    (2006.01)
*H04L 7/00*    (2006.01)

(52) U.S. Cl. ...................................... 375/376; 375/355

(58) Field of Classification Search ................ 375/326, 375/327, 371, 373, 375, 376, 354, 355, 232, 375/234; 327/156, 145, 141, 100; 360/51, 360/55, 69, 70; 369/59.19, 59, 47.48, 47.28

See application file for complete search history.

(56) References Cited

U.S. PATENT DOCUMENTS

| | | | | |
|---|---|---|---|---|
| 5,675,565 A | * | 10/1997 | Taguchi et al. | 369/47.35 |
| 5,966,415 A | * | 10/1999 | Bliss et al. | 375/350 |
| 6,047,073 A | * | 4/2000 | Norris et al. | 381/61 |
| 6,084,907 A | * | 7/2000 | Nagano et al. | 375/230 |
| 6,304,538 B1 | * | 10/2001 | Hayashi | 369/59.22 |
| 6,408,023 B1 | * | 6/2002 | Abdesselem et al. | 375/232 |
| 6,426,972 B1 | * | 7/2002 | Endres et al. | 375/229 |
| 6,614,841 B1 | * | 9/2003 | Ohta | 375/232 |
| 6,654,413 B1 | * | 11/2003 | Shimoda | 375/232 |

* cited by examiner

*Primary Examiner*—Tesfaldet Bocure
*Assistant Examiner*—Vineeta Panwalkar
(74) *Attorney, Agent, or Firm*—Ladas & Parry LLP (57) ABSTRACT

A data-reproduction apparatus in which an RF signal that is input from a disk to an A/D converter via a pick-up and RF signal generator is sampled according to a sampling clock from a clock generator and converted to a sample-value series. This sample-value series is input to a phase-correction unit via a delay element, and its phase is corrected based on a phase-error signal from a phase-detection unit, then it is demodulated by a demodulator to become user data. On the other hand, the sample-value series, whose phase has been corrected, is input to a phase-detection unit where the phase error is detected, and a generated phase-error signal is then supplied to both the phase-correction unit and the clock generator. In this way a first PLL is followed by a second PLL, which makes it possible to easily widen the bandwidth of the second PLL without including a delay element in the loop.

10 Claims, 12 Drawing Sheets

DATA REPRODUCTION APPARATUS

BACKGROUND OF THE INVENTION

1. Field of the Invention

The present invention relates to the technical field of a data reproduction apparatus for reproducing digital data according to a reproduction signal that is read from a recording medium, and more particularly, to the technical field of a data reproduction apparatus that samples a reproduction signal according to a sampling clock and converts it to a sample-value series, and using a PLL (Phase Locked Loop), performs phase synchronization of the sample-value series.

2. Description of the Related Art

Recently, the use of a data reproduction apparatus, which reproduces digital data using a large-capacity, disk-shaped recording medium such as a DVD, has become popular. In this kind of data reproduction apparatus, an RF signal that corresponds to a pit line on the surface of the disk is read by a pick up, and this analog RF signal is converted to a digital sample-value series by an A/D converter. The sampling clock that is supplied to the A/D converter is necessary for synchronizing the phase of the sample-value series, so there is a PLL for detecting the phase of the sample-value series and feeding it back to the clock generator. The PLL follows the high reading speed for the recording medium, so it is preferred that the bandwidth be made as wide as possible, that is, the wider the PLL bandwidth is, the shorter the amount of time it takes to synchronize the sample-value series.

However, in the data reproduction apparatus described above, there are various delay elements in the path of the sample-value series. For example, the high-frequency emphasis circuit, processing circuits or for processing the sample values, or adaptive signal processing become delay elements. Also, when these delay factors are inserted in the PLL loop, dead time occurs and the phase margin of the PLL is reduced. Moreover, when it is not possible to maintain an adequate phase margin, it becomes difficult to increase the bandwidth of the PLL. For this kind of data reproduction apparatus with PLL, there was a problem in that widening the bandwidth of the PLL was limited by the existence of delay elements.

SUMMARY OF THE INVENTION

Taking the aforementioned problems into consideration, it is the object of this invention to provide a data reproduction apparatus that is capable of widening the bandwidth of the PLL, regardless of the existence of delay factors, and performing stable phase synchronization with good followability when using PLL to synchronize the phase of a reproduction signal that is read from a recording medium.

The above object of the present invention can be achieved by the following a data-reproduction apparatus for reproducing digital data based on a reproduction signal that is read from a recording medium.

The data-reproduction apparatus is provided with: a conversion device of sampling said reproduction signal according to a sampling clock and converting the said reproduction signal to a sample-value series; a phase-correction device of correcting said sample-value series according to a phase-error signal; a phase-detection device of detecting the phase-error signal of said sample-value series whose phase has been corrected; and a clock generation device of generating said sampling clock for synchronizing said sample-value series according to said phase-error signal.

In this invention, there is a first PLL in the path of the sample-value series based on the reproduction signal, comprising a conversion device, phase correction device, phase detection device, and clock generation device, and there is also a second PLL comprising a phase correction device and a phase detection device. With the first PLL and the second PLL that follows it, the second PLL is not affected even when there are delay elements between the conversion device and the phase correction device, so it is possible to obtain a data recording and reproduction apparatus that is capable of widening the bandwidth of the second PLL and performing stable phase synchronization with excellent followability.

In one aspect of the data-reproduction apparatus of the present invention, said phase-correction device is provided with a transversal filter having a plurality of taps.

According to the present invention, a transversal filter having a plurality of taps is used as a way of correcting the phase, so it is possible to relatively easily correct the phase of the sample-value series.

In another aspect of the data-reproduction apparatus of the present invention, said phase-correction device is provided with a transversal filter having a plurality of taps, and said transversal filter uses a transfer function that is symmetrical around the center position for performing the filtering operation, and sets tap coefficients according to said phase-error signal.

According to the present invention, the phase of the sample-value series that is input to the transversal filter is corrected by a symmetrical transfer function using tap coefficients based on the phase-error signal. Therefore, it is possible to prepare a transfer function such as an impulse response, and perform a filtering operation easily while changing the tap position.

In another aspect of the data-reproduction apparatus of the present invention, said phase-correction device is provided with a transversal filter having a plurality of taps and said transversal filter uses a transfer function that is symmetrical around the center position for performing the filtering operation, and selectively switches the connection of said plurality of taps according to said phase-error signal.

According to the present invention, the sample-value series that is input to the transversal filter, switches the connection for each tap based on the phase-error signal, and is corrected by the symmetrical transfer function. Therefore, it is possible to prepare a transfer function such as an impulse response, and perform a filtering operation easily while changing the tap position.

In further aspect of the data-reproduction apparatus of the present invention, said phase-correction device is provided with a transversal filter having a plurality of taps, and said transversal filter selectively sets taps coefficients at tap positions that are symmetrical around a center tap according to the polarity of the phase-error signal.

According to the present invention, it is possible to select symmetric tap coefficients for the sample-value series, which is input to the transversal filter, that correspond to the polarity of the phase-error signal. Therefore, the same transversal filter construction can be used for when the phase-error signal is either positive or negative.

In further aspect of the data-reproduction apparatus of the present invention, said phase-correction device is provided with a transversal filter having a plurality of taps, and there is a conversion table containing table values that correspond to tap coefficients and wherein said transversal filter sets tap coefficients for each tap position by referencing that conversion table.

According to the present invention, setting the tap coefficients for the transversal filter is done by referencing a conversion table, so it is possible to digitize the transfer function, and with a simple process, perform the specified filtering operation.

In further aspect of the data-reproduction apparatus of the present invention, said phase-correction device is provided with a transversal filter having a plurality of taps, and said transversal filter sets the tap coefficients to zero for the tap positions that are furthest away from said center tap position when the absolute value of said phase-error signal is greater than a specified threshold value.

According to the present invention, when the absolute value of the phase-error signal that is supplied to the transverse filter is large, filtering is performed after setting the tap coefficients of separated tap positions to zero, so it is possible to suppress shifting of the symmetry of the tap positions in the transfer function, and thus it is possible to perform high-precision filtering.

In further aspect of the data-reproduction apparatus of the present invention, said phase-correction device is provided with a transversal filter having a plurality of taps, and said phase-error signal changes in a range that exceeds one cycle of said clock, and where said transversal filter selectively switches the connection of said plurality of taps according to the change in said phase-error signal.

According to the present invention, the width of change in the phase-error signal that is supplied to the transversal filter is made large, and the corresponding tap connections are switched, so it is possible to increase the size of the correction range for correcting the sample-value series in the second PLL.

In further aspect of the data-reproduction apparatus of the present invention, said phase-correction device is provided with a transversal filter having a plurality of taps, said phase-error signal changes in a range that exceeds one cycle of said clock, said transversal filter selectively switches the connection of said plurality of taps according to the change in said phase-error signal, and said transversal filter has n taps, and selectively connects m adjacent taps (m<n) according to the change in said phase-error signal.

According to the present invention, the transversal filter is based on n-tap construction, and adjacent m taps, which correspond to the change in the phase-error signal, are connected for actual filtering, so it is possible to increase the size of the correction range for correcting the sample-value series in the second PLL.

In further aspect of the data-reproduction apparatus of the present invention, the data-reproduction apparatus is provided with: a conversion device of sampling said reproduction signal according to a sampling clock and converting the said signal to a sample-value series; a phase-correction device of correcting said sample-value series according to a phase-error signal; a phase-detection device of detecting the phase error of said sample-value series whose phase has been corrected; and a clock generation device of generating said sampling clock for synchronizing said sample-value series according to said phase-error signal, and said phase-detection device is further provided with a zero-cross-detection device of detecting the zero-cross of said sample-value series.

According to the present invention, in the phase detection device, the zero-cross of the input sample-value series is detected, and from this the phase error is detected, so it is possible to find a more accurate phase error from digital processing.

DESCRIPTION OF THE PREFERRED EMBODIMENTS

The preferred embodiment of the invention will be explained based on the drawings. For this embodiment, application of the invention to a data reproduction apparatus, which reproduces user data from a disk-shaped recording medium such as a DVD and outputs that user data to the outside, will be explained.

Figure 1:
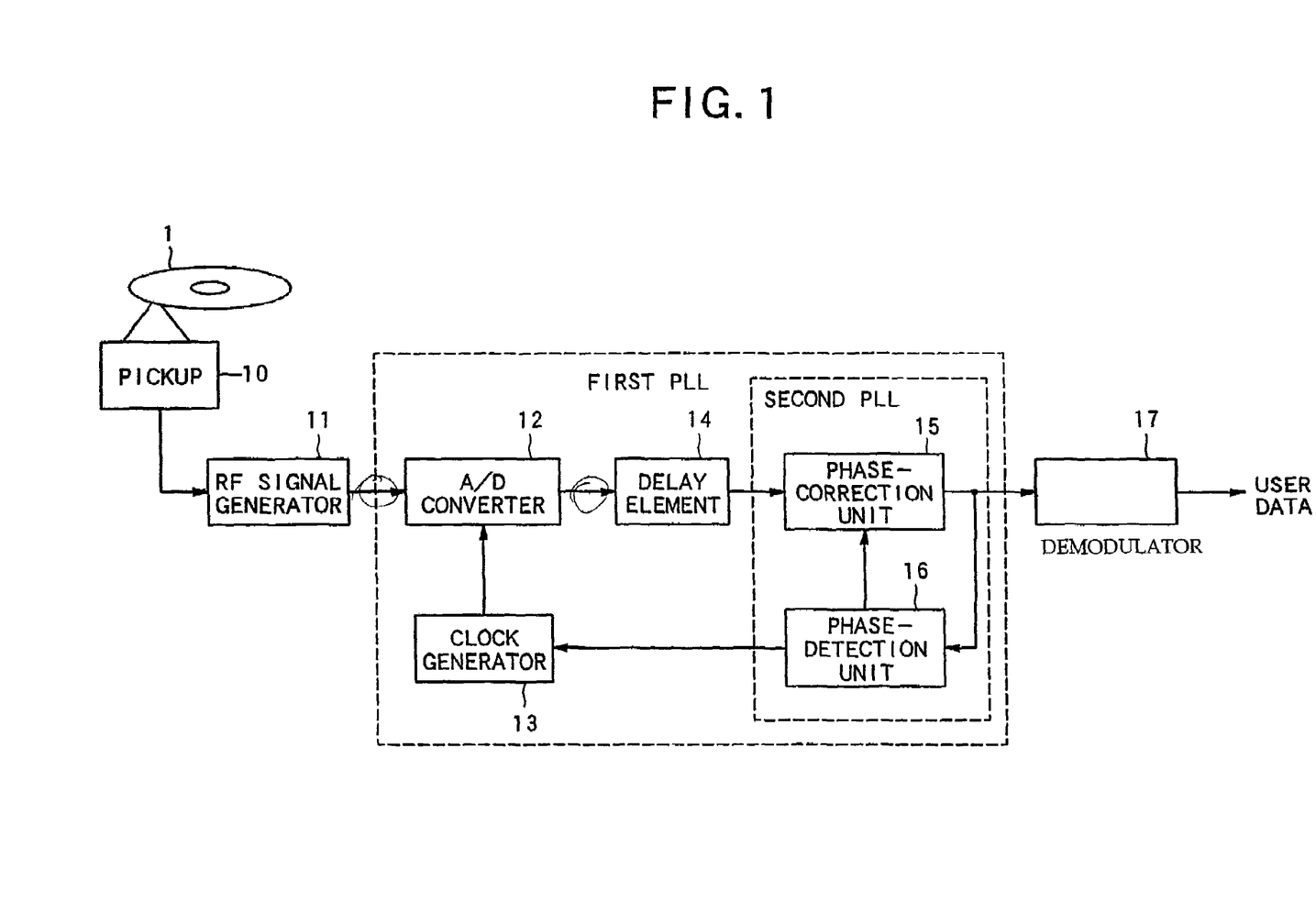
FIG. 1 is a block diagram showing the main construction of the data reproduction apparatus of an embodiment of the invention.

FIG. 1 is a block diagram showing the major configuration of the data reproduction apparatus of this embodiment of the invention. The embodiment shown in FIG. 1 is provided with a pickup 10 that reproduces the data from a mounted disk 1, a RF signal generator 11, an A/D converter 12, a clock generator 13, a delay element 14, a phase-correction unit 15, a phase-detection unit 16 and a demodulation unit 17. The overall reproduction operation is controlled entirely by a CPU (not shown in the figure), and control signals are sent from the CPU to all of the components.

A feature of the construction shown in FIG. 1 is a first PLL and a second PLL that follows it. The first PLL is a loop that is provided with an A/D converter 12, a delay element 14, a second PLL, and a clock generator 13. The second PLL is a loop that is provided with a phase-correction unit 15 and a phase-detection unit 16. As will be described later, in the data reproduction apparatus of this embodiment, with the first and second PLL working together, it is possible to improve followability of the phase synchronization, or in other words widen the bandwidth.

In FIG. 1, the pickup 10 is provided with a laser source (not shown in the figure), which shines a light beam onto the disk 1 and outputs a received light signal that corresponds to the bit pattern on the disk, an optical system, and a detector. Also, based on the received light signal that is output from the pickup 10, the RF signal generator 11 generates an RF signal, which is an analog reproduction signal whose level changes according to the bit string that is formed on the disk 1. For example, in the case that the detector of the optical pickup 10 is divided into four divisions, the RF signal is obtained by taking the sum of the received light signals from four areas.

The A/D converter 12 samples the RF signal according to a phase-synchronized sampling clock that is supplied from the clock generator 13, and converts the analog signal to a digital signal, then outputs the obtained sample-value series. Under ideal conditions, the sample-value series that is output from the A/D converter 12 matches the position to be sampled in the bit string. However, for various reasons, phase error occurs, and it becomes necessary to perform phase control, as will be described later.

The clock generator 13 contains a Voltage Controlled Oscillator (VCO) for generating the aforementioned sampling clock, and by controlling the frequency and phase of this VCO according a control voltage, it is possible to synchronize the phase of the sample-value series. In addition, there is a loop filter in the clock generator 13 for smoothing out the phase-error signal that is output from the phase-detector unit 16. This loop filter is an integrator having a specified time constant, and the output provides the aforementioned control voltage.

The delay element 14 collectively represents all of the elements in the first PLL loop of the data reproduction apparatus that cause delays in the phase. For example a high-frequency emphasis circuit or a signal-processing circuit that performs proper signal processing could make up the delay element 14. The delay element 14 causes there to be unneeded time in the PLL, and is related to a decrease in phase allowance. This becomes a limiting factor when widening the bandwidth of the PLL, however, in this embodiment, with the construction described later, it is possible to increase the bandwidth of the PLL.

The phase-correction unit 15, having a plurality of taps, contains a transversal filter that performs digital filtering of the sample-value series using a tap coefficient that corresponds to the objective transfer function, in order to correct the phase of the sample-value series after it passes the delay element 14. This transversal filter is constructed such that it performs filtering by referencing a conversion table that will be described later, and sequentially updates the tap coefficient, and sets a proper tap coefficient according to the phase-error signal that is supplied from the aforementioned phase-detection unit 16. The construction and operation of the phase-correction unit 15 will be described in detail later.

The phase-detection unit 16 performs zero-cross detection on the sample-value series after the phase has been corrected and it has been output from the phase-correction unit 15 and extracts the zero-cross sample value, then generates a phase-error signal based on that value. This phase-error signal is a data series that is made from the phase error that is extracted from the sample-value series after phase correction, and in the second PLL, this data string is supplied to the phase-correction unit 15 as described above, and in the first PLL, this data string is supplied to the clock generator 13.

The demodulation unit 17 performs necessary signal processing, such as error correction, on the sample-value series after the phase has been corrected and it has been output from the phase-correction unit 15, and then demodulates the data and outputs it as user data to the outside.

In this embodiment, a second PLL is added to a first PLL, so it is possible to reduce the effect of the delay element 14. In other words, when there is only a first PLL, wasted time occurs in the PLL due to the delay element 14, and the phase allowance is reduced, so it becomes difficult to increase the bandwidth of the PLL. However, in the case of the construction of this embodiment, in the loop of the separate second PLL, there is no delay element 14, so it is possible to widen the bandwidth. In other words, the bandwidth of the first PLL is left narrow, and by increasing the bandwidth of the second PLL, a slow disturbance is followed by the first PLL, and for a high-frequency disturbance, phase correction is performed on the sample-value series by the second PLL, so good characteristics can be obtained over a wide range of frequencies.

Figure 2:
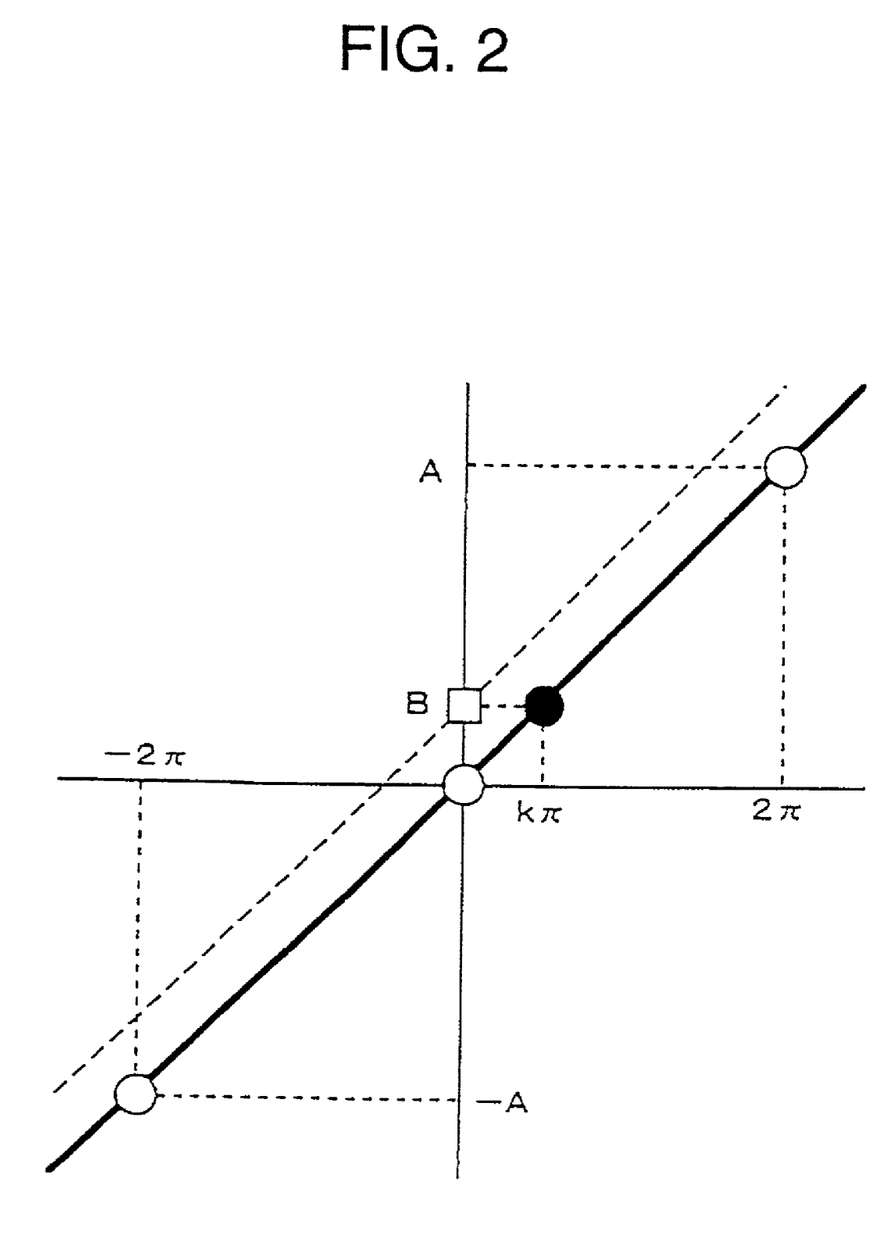
FIG. 2 is a drawing explaining the general concept of the method for detecting the phase error by the phase-detection unit.

Next, the operation of the phase-detector unit 16 that is included FIG. 1 will be explained in detail. FIG. 2 is a drawing giving a general explanation of the method used by the phase-detection unit 16 for detecting the phase error. FIG. 2 corresponds to the sample-value series that is input to the phase-detection unit 16, and in the figure the horizontal axis corresponds to the time of the sample values, and the vertical axis corresponds to the sample values (corresponds to the range of the A/D converter 12). Also, the three white circles in FIG. 2 indicate the sample values when the phase error is zero. The range in FIG. 2 is near the zero cross, so it can be assumed that the sample values for each of the three white circles are connected by a straight line. This straight line can be expressed by the following equation using the horizontal axis X, vertical axis Y and the sample value A in FIG. 6.

$$Y = AX/(2\pi) \quad (1)$$

When the horizontal axis X in Equation (1) is normalized by $\pi$, the equation becomes Equation (2) below.

$$Y = AX/2 \quad (2)$$

On the other hand, the phase-detection unit 16 extracts the zero-cross sample values in the sample-value series that exist at positions that are separated from the positions of the white circles in FIG. 2. When the polarity between the previous and next sample value is determined to go from negative to positive or from positive to negative, certain sample values that are closest to zero in the direction of change are selected as zero-cross sample values. The black circle in FIG. 2 indicates a zero-cross sample value that was selected in this way. From this, the phase error k can be expressed by the following equation by using the black circle sample value B and white circle sample values A, and by normalizing the horizontal axis X by $\pi$.

$$k = 2B/A \quad (3)$$

Actually, the actual sample-value series, which includes the aforementioned phase error k, changes as shown by the dotted lines in FIG. 2. In this case, the aforementioned black circle sample value B is selected as the sample value B indicated by the square on the Y-axis in FIG. 2. In other words, the sample-value series near the zero-cross is expressed by the following equation.

$$Y = AX/2 + B \quad (4)$$

By changing the sample-value series for the phase error k in this way based on Equation 3 above and then sequentially updating the series, a phase-error signal is output from the phase-detection unit 16, and fed back to the clock generator 13 and phase-correction unit 15.

Next, the construction and operation of the phase-correction unit 15 included in FIG. 1 will be explained in detail. The basic concept, detailed construction and examples of variations of the phase-correction unit 15 will be explained with reference to FIG. 3 to FIG. 11.

Figure 3:
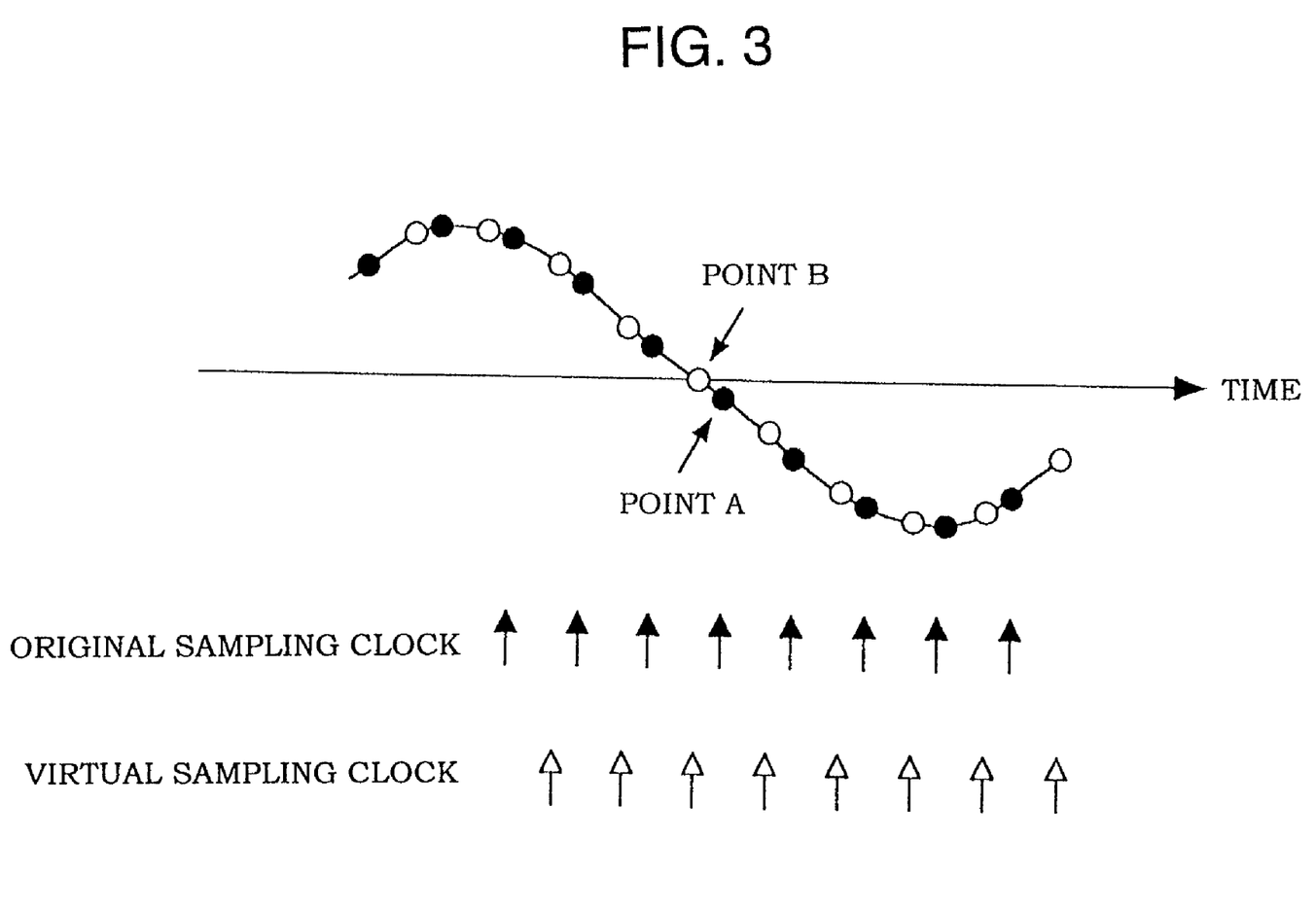
FIG. 3 is a drawing explaining the general concept of correcting the phase of the sample-value series by the phase-correction unit.

First, the operation of the phase-correction unit 15 will be explained. FIG. 3 is a drawing showing the concept of the phase correction that is performed on the sample-value series by the phase-correction unit 15. In FIG. 3, the sample-value series that is shown by the black circles are values input in order along the time axis. Also, of the black circles, the black circle for the sample value at point A near the zero-cross does not become zero due to the effect of some disturbance. The shift from zero at point A corresponds to the amount of phase error that is detected by the phase-detection unit 16. When the phase of the sample-value series is corrected by the phase-correction unit 15 based on this amount of phase error, it is possible to obtain the sample-value series indicated by the white circles in FIG. 3. In this case, the black circle at point A moves to the white circle at point B, so it is possible to obtain the zero-cross sample value. As shown at the bottom of FIG. 3, the operation of the phase-correction unit 15 samples the RF signal according to a sampling clock from the clock generator 13, and then performs sampling again by a virtual sampling clock, whose phase is shifted a little from the sampling clock.

Next, the concept of a digital filter operation will be explained, that is realized by a transversal filter. The operation of the transversal filter can be expressed by the following equation using the phase error k described above, and a transfer function H(z) for the input sample-value series.

$$H(z)=\Sigma An(k)\cdot z^{-n}(-\infty \leq n \leq \infty) \quad (5)$$

$$An(k)=\sin(k+2n\pi)/(k+2n\pi) \quad (6)$$

The tap coefficients for the transversal filter are given by An(k), however, for the conditions of Equations (5) and (6), the range for n is infinity, so in reality it is necessary to set finite tap coefficients. Here, as n approaches ∞ (n→∞), An(k) approaches zero (An(k)→0) according to Equation (6), so it is possible to set the range −M≦n≦L (where M and L are integers).

In the phase-correction unit 15, the tap coefficients required for the transversal filter are prepared. Here, when the relationship, An(k)=A−n(k), is established, the tap coefficients are made common, so it is possible to reduce the number of taps. In other words, it is possible to perform the filtering operation by simply preparing tap coefficients for An(k) (0≦n≦max (M, L)), or for An(abs (k)) (0≦k) (where "max" indicates a large number, and "abs" indicates the absolute value).

Figure 4:
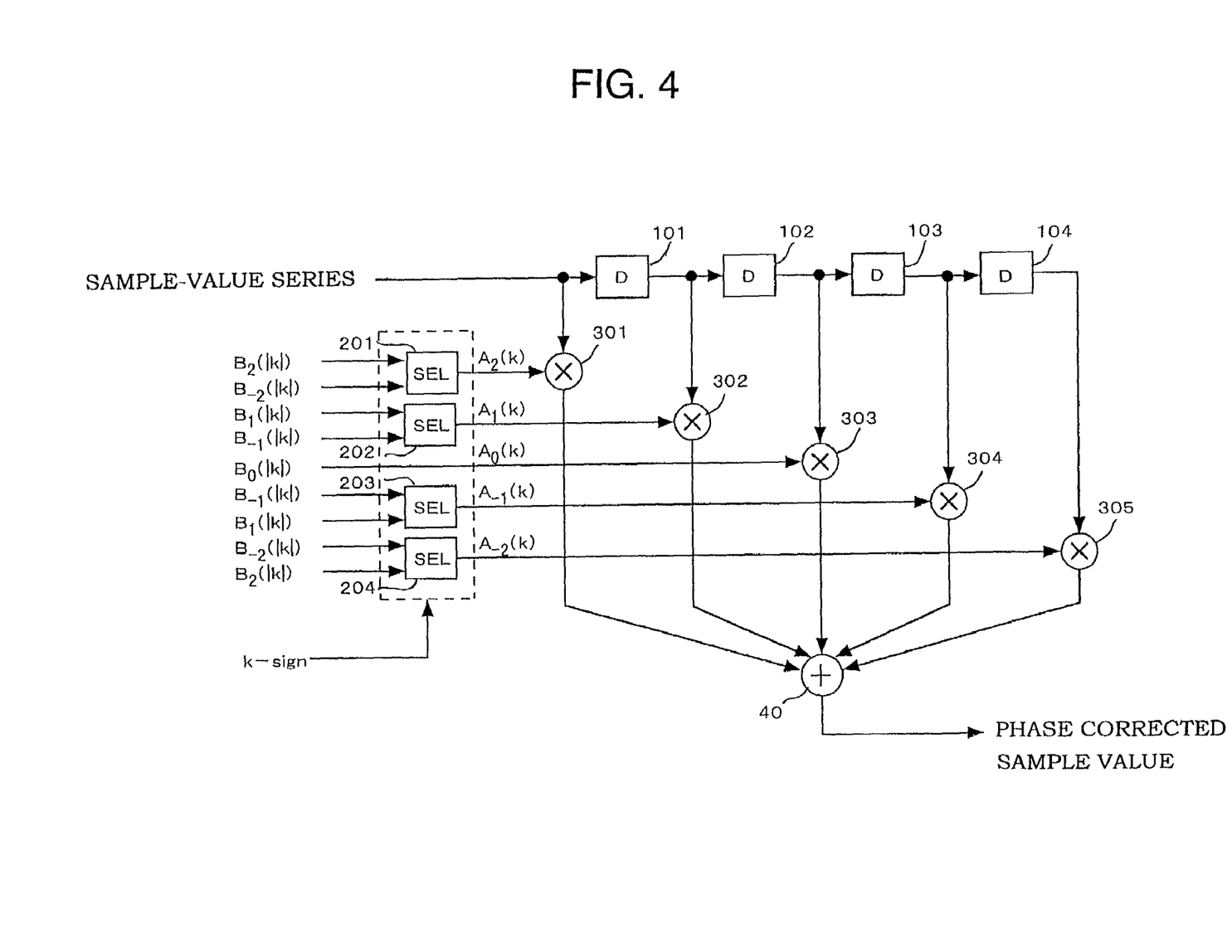
FIG. 4 is a block diagram showing the detailed construction of the phase-correction unit.

Next, FIG. 4 is a block diagram showing the detailed construction of the phase-correction unit 15. As shown in FIG. 4, the phase-correction unit 15 of this embodiment is provided with: four delay elements 101 to 104 (indicated by D in the figure), four selectors 201 to 204 (indicated by SEL in the figure), five multipliers 301 to 305 and an adder 40. Also, FIG. 5 is a block diagram showing the construction of additional circuits that are added to the construction shown in FIG. 4, including an absolute-value circuit 50 and a conversion table 60 (having five tables T1 to T5).

In FIG. 4, the sample-value series that is supplied from the A/D converter 12 via the delay element 14 is input to the delay element 101, and a sample value that is delayed one block is output. After this, the sample value is input in order to the delay elements 102, 103 and 104, and sequentially delayed by one block. Also, the sample value before being delayed is input to the multiplier 301 and the delayed sample values that are output from the delay elements 101 to 104, are input to the multiplier 302 to 305, respectively. The delay elements 101 to 104 are connected in series in this way, and all together they form a 5-tap transversal filter.

On the other hand, it is necessary to supply tap coefficients for the multipliers 301 to 304 according to the phase error from the phase-detection unit 16. First, as shown in FIG. 5, the phase error k that is output from the phase-detector unit 16 is input to the absolute-value circuit 5, and the absolute-value circuit 5 outputs the absolute value (abs (k)) of the phase error. In other words, in order to have tap coefficients in common for both positive and negative phase error k, as described above, the positive phase error k is made standard by the absolute-value circuit 5. At this time, the sign k-sign for the phase error k is obtained, and supplied to the selectors 201 to 204 as shown in FIG. 4 and as will be described later.

Figure 5:
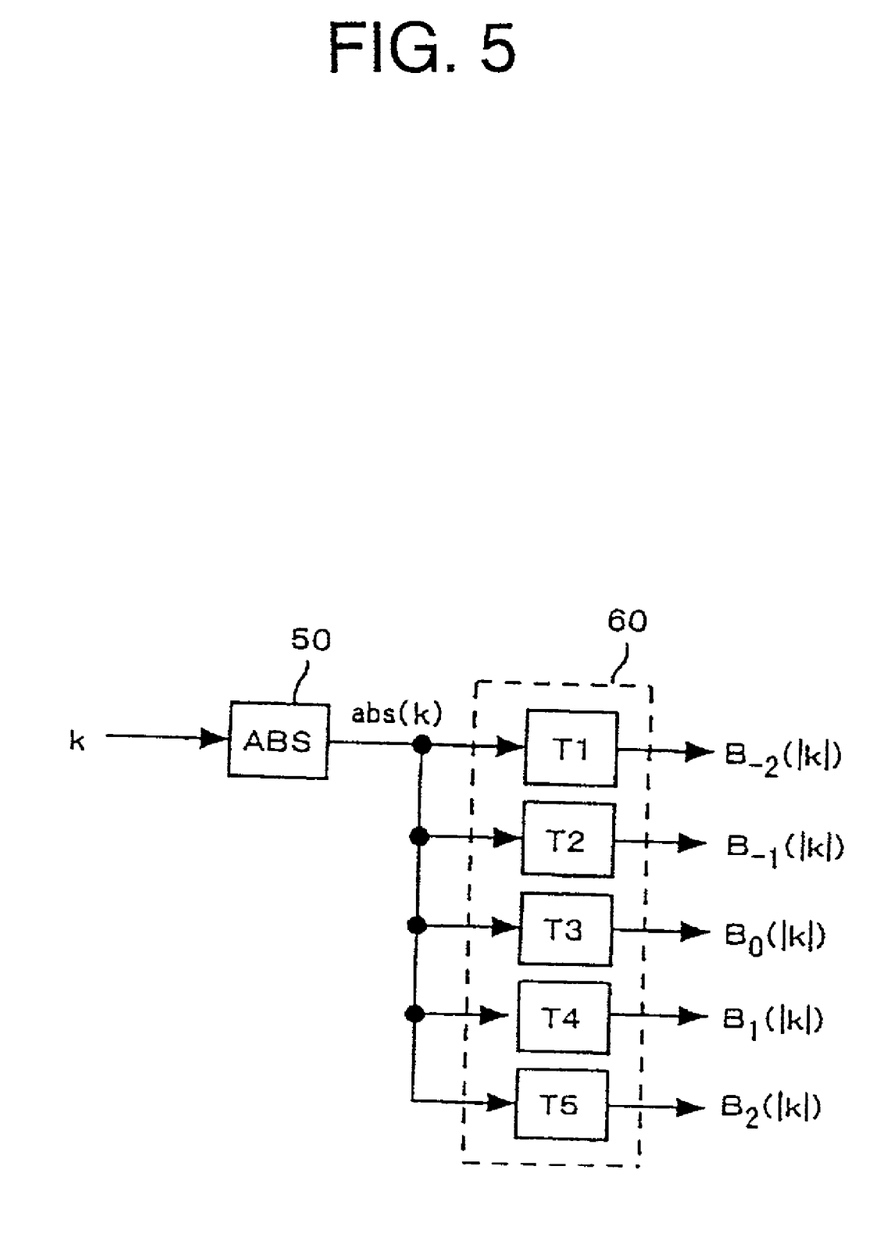
FIG. 5 is a block diagram showing the construction of an additional circuit that is added to the construction shown in FIG. 4.
Figure 6:
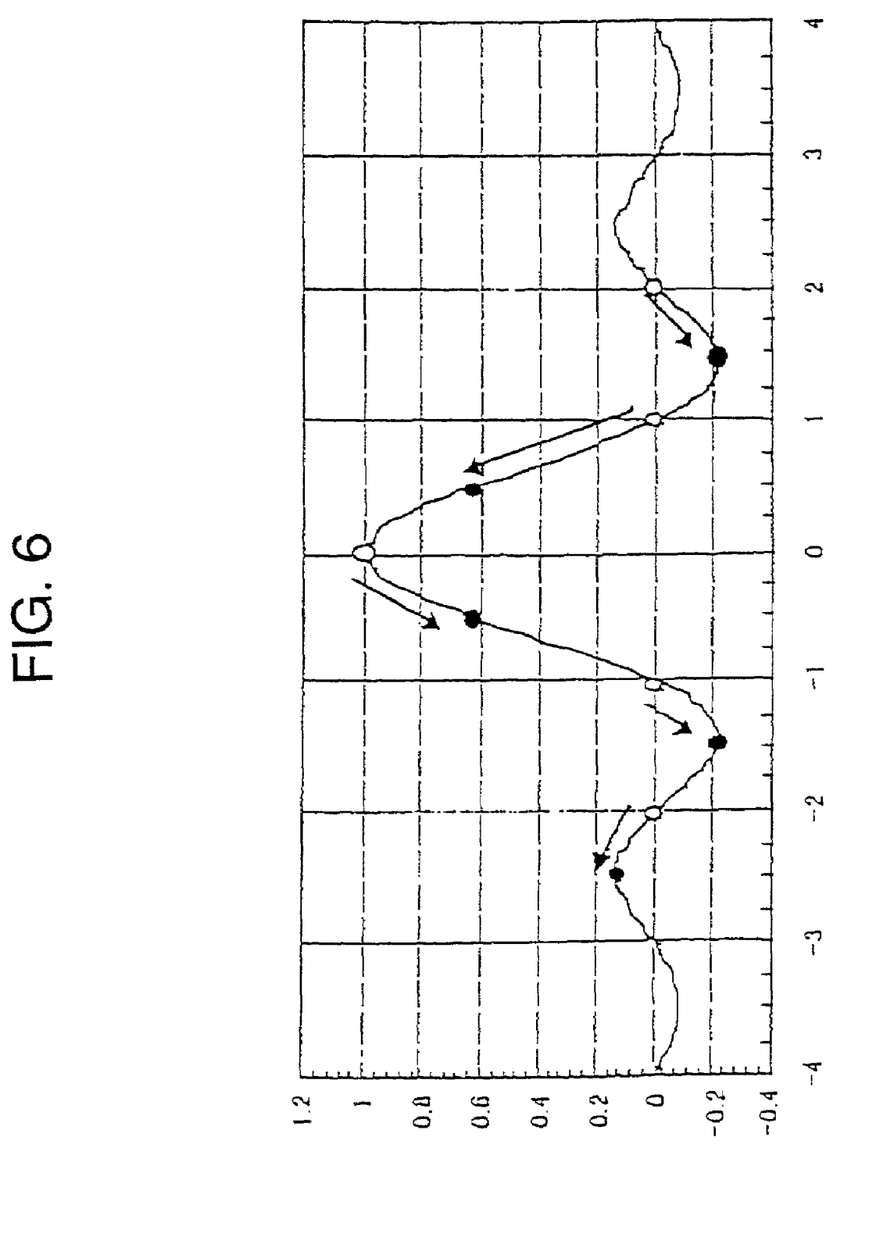
FIG. 6 is a drawing that explains the data in the conversion table for tap coefficients.

Also, in FIG. 5, table values that are references from each of the tables T1 to T5 of the conversion table 60 are output based on the absolute value abs(k) of the phase error. FIG. 6 is a drawing explaining the data contents of the conversion table 60 in which the tap coefficients are entered. The horizontal axis of FIG. 6 is the tap position where 1 corresponds to one block. Also, along the vertical axis in FIG. 6 are the table values that correspond to the tap positions, and the tap coefficients are set from this. In addition, as shown by the solid line in FIG. 6, the table values changed according to the transfer function of the impulse response.

The five white circles in FIG. 6 correspond to 5-tap construction, and show the five table values that are selected when the phase error k=0. In other words, the table value for the center tap, which is zero on the horizontal axis, and the table values at symmetrical tap positions −1, −2, 1 and 2 on the left and right of the center tap position. In the conversion table 60 in FIG. 5, the table T1 output the table value for tap position −2, table T2 outputs the table value for tap position −1, table T3 outputs the table value for the center tap (tap position 0), table T4 outputs the table value for tap position 1, and table T5 outputs the table value for tap position 2. When the phase error k is zero in the second PLL, tap coefficients that correspond to the five white circles described above are used. As a result, the transversal filter functions so as to multiply the sample-value series with the impulse response, and no transition on the time axis occurs.

On the other hand, when the phase error k is not zero, the tap positions of the white circles described above are shifted and the table values are referenced. For example, when the phase error k=π, the white circles in FIG. 5 are taken as a reference, and the table values, which are shifted in the direction of the arrows and indicated by the five black circles, are selected. In other words, the tap positions of the five black circles shift to the left just 0.5 from the tap positions of the white circles. At this time, each the tables T1 to T5 in the conversion table 60 shown in FIG. 5 output table values for the tap positions that have been shifted according to the phase error k. In FIG. 4, tap positions −1, −1, 0, 1 and 2 are taken to be a reference, and five table values $B_{-2}$(abs (k)), $B_{-1}$(abs (k)), $B_{0}$(abs (k)), $B_{1}$(abs (k)) and $B_{2}$(abs (k)), which are the phase-error k function, are output from each of the tables T1 to T5. As a result, the transversal filter multiplies the sample-value series with the impulse response that moves on time axis, and corrects the phase of the sample-value series.

Next, in FIG. 4, the selectors 201 to 204 are controlled so as to switch the connection based on the sign k-sign of the phase error k, and supplies tap coefficients for the multipliers 301 to 305. It is possible to use a sign bit (MSB) of the phase error k as this sign k-sign. Of the two table values that are input to each of the selectors 201 to 204, when the phase error k is positive (k-sign has a low level), the upper value is selected, and when the phase error k is negative (k-sign has a high level), the lower value is selected. In addition, the tap coefficients $A_2(k)$, $A_1(k)$, $A_{-1}(k)$ and $A_{-2}(k)$ are respectively output from the selectors 201 to 204 according to the selection results.

In more detail, when the phase error k is positive, table value $B_2(abs(k))$, table value $B_1(abs(k))$, table value $B_{-1}(abs(k))$ and table value $B_{-2}(abs(k))$ are selected as tap coefficients by selectors 201 to 204, respectively. On the other hand, when the phase error k is negative, table value $B_{-2}(abs(k))$, table value $B_{-1}(abs(k))$, table value $B_1(abs(k))$ and table value $B_2(abs(k))$ are selected as tap coefficients by selectors 201 to 204, respectively.

The first multiplier 301 multiplies the input sample value by the tap coefficient $A_2(k)$ from the selector 201 and outputs the result. Also, the multiplier 302, multiplies the sample value from the delay element 101 by the tap coefficient $A_1(k)$ from the selector 202 and outputs the result.

On the other hand, the multiplier 303, which corresponds to the center tap, uses the table value $B_0(abs(k))$ from table T3 of the conversion table 60 as is as the tap coefficient $A_0(k)$, and multiplies the sample value from the delay element 102 with it and outputs the result. As shown in FIG. 5, at the tap position 0 for the center tap, there is no need for a selector since the direction of change is the same for both a negative or positive phase error k.

Next, the multiplier 304 multiplies the sample value from the delay element 103 by the tap coefficient $A_{-1}(k)$ from the selector 203 and outputs the result. Also, the multiplier 305 multiplies the sample value from the delay element 104 by the tap coefficient $A_{-2}(k)$ from the selector 204 and outputs the result.

The five multiplied results that were output from the five multipliers 301 to 305 in this way are then input to the adder 40 and added, and the result is output. The result that is output from the adder 40 is output to the phase-detection unit 16 and the clock generator 13 as the sample-value series for which the phase error k has been corrected.

Figure 7:
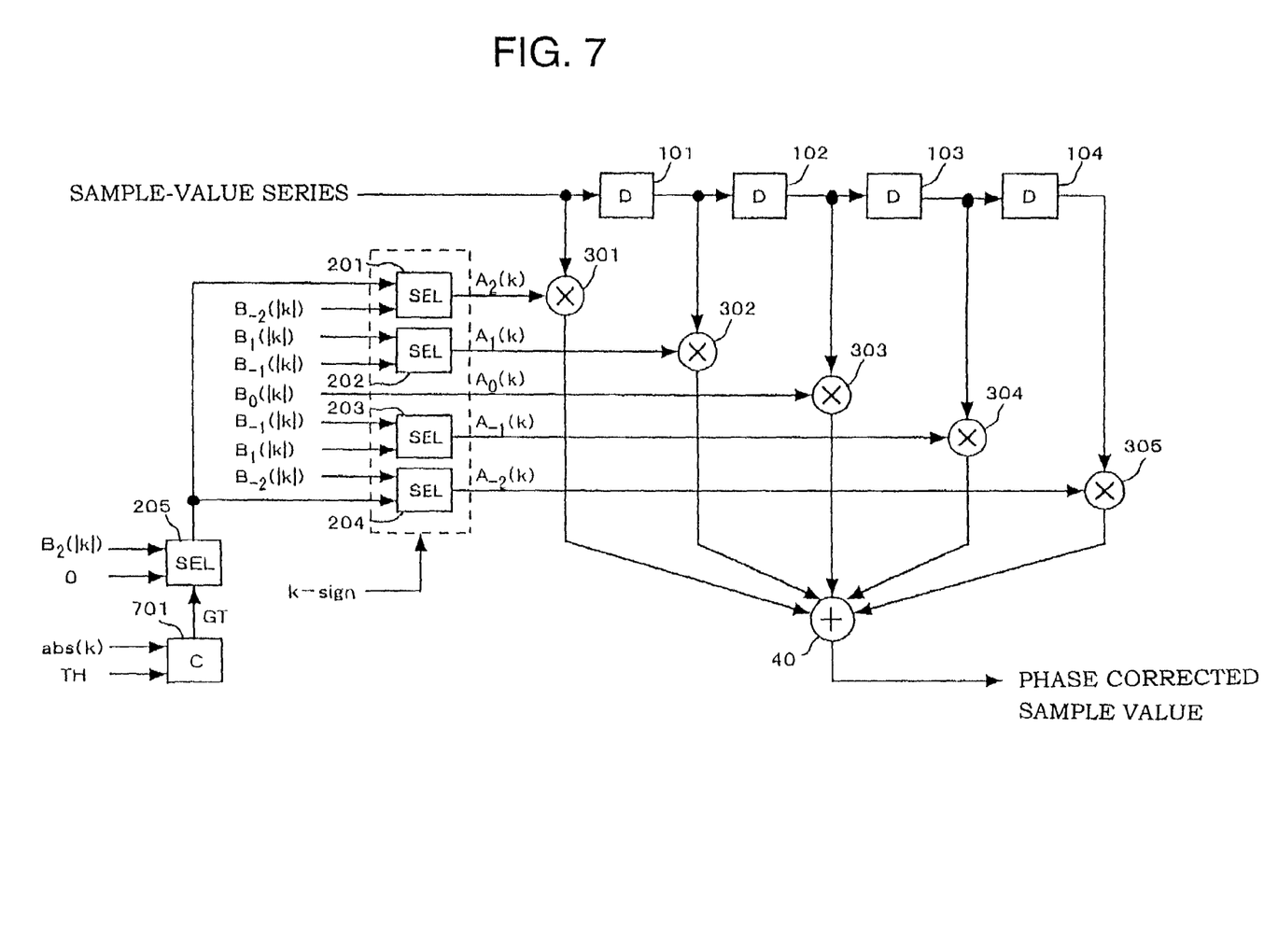
FIG. 7 is a block diagram showing the detailed construction of the phase-correction unit of a first example of changes to the embodiment of this invention.

Next, a first example of a changed phase-correction unit will be explained. FIG. 7 is a block diagram showing the detailed construction of the phase-detection unit 15 of this first example of changes. As can be seen in FIG. 7, this example differs from the construction shown in FIG. 4 in that there is a selector 205 and a comparator 701 (indicated by C in the figure). The additional circuits in this first example of change are the same as that shown in FIG. 5.

In FIG. 7, the absolute value of the phase error abs(k), which is output from the absolute-value circuit 50 in FIG. 5, and a specified threshold value TH are input to the comparator 701 and compared to find which is larger or smaller, and when abs(k) is larger than the threshold value TH, the comparator 701 outputs a signal GT. This signal GT is supplied to the selector 205.

On the other hand, the table value $B_2(abs(k))$ described above and zero are input to the selector 205, and one of these is selectively output to selector 201 and selector 204 in a later stage. The connection of the selector 205 is switched based on the signal GT, and zero is selected when the signal GT (high level) is input, and the input to selector 201 and selector 204 becomes zero. As a result, with the abs(k) greater than the threshold value TH, zero is output from selector 201 when the phase error k is positive, and zero is output from selector 204 when the phase error k is negative.

Figure 8:
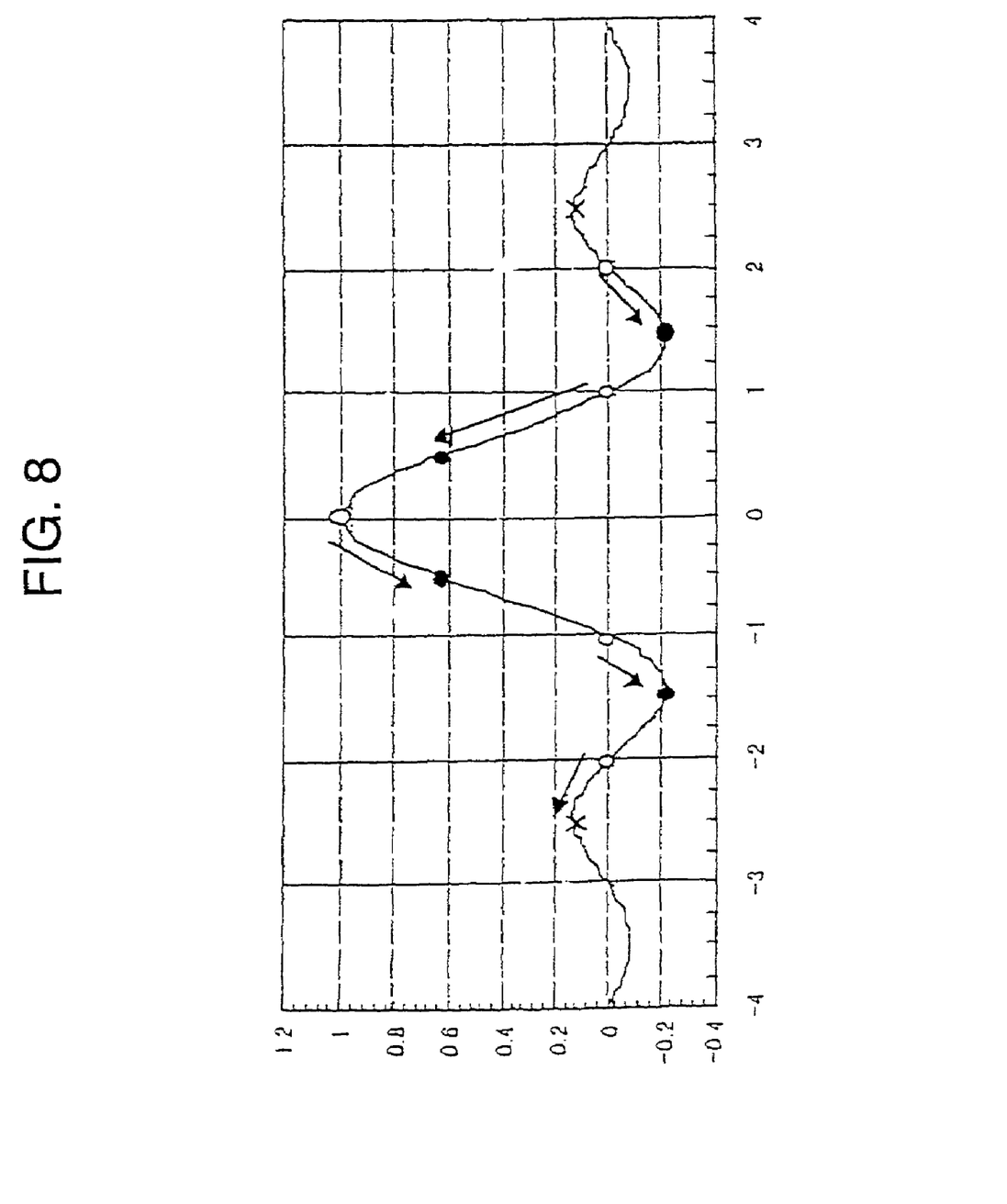
FIG. 8 is a drawing that explains the data in the conversion table for tap coefficients that are used in the first example of changes to the embodiment, and corresponds to the conversion table shown in FIG. 6.

FIG. 8 is a drawing explaining the data contents of the conversion table 60 for the tap coefficients that are used in the first example of change, for the conversion 60 shown in FIG. 6. In FIG. 8, the same white circles as shown in FIG. 6 are taken to be a reference, and it shows four black circles and an 'X' mark on the left end for when the values shift 0.5 in the direction of the arrows. The 'X' mark shows that due to the function of the selector 205 and comparator 701 in FIG. 7, the original tap coefficient $A_{-2}(k)$ is invalid and becomes zero.

In this case, when the 'X' mark on the left end is made valid as a tap coefficient, all of the tap positions in FIG. 8 shift to the left and it is not possible maintain symmetry, however by making the tap coefficient of the 'X' mark on the left end invalid so that there is actually only 4-tap construction, it is possible to maintain a certain amount of symmetry among the tap coefficients. The same is true when there is an overall shift to the right of the tap coefficients in the case of the 'X' mark on the right end of FIG. 8. In this first example of change, by switching whether to make valid or invalid the tap coefficient for a tap position based on the threshold value TH shown in FIG. 7 in this way, it is possible to improve the symmetry of the tap coefficients.

Next, a second example of changes to the phase-correction unit 15 will be explained. In this second example of change, the major role is the same as that of first example described above, however, the construction of the transversal filter is different. In other words, in the case of the first example of change, the tap coefficients are selectively switched by the selectors 201 to 204, however, in the case of this second example of change, the taps (delay elements 101 to 104) are selectively switched.

Figure 9:
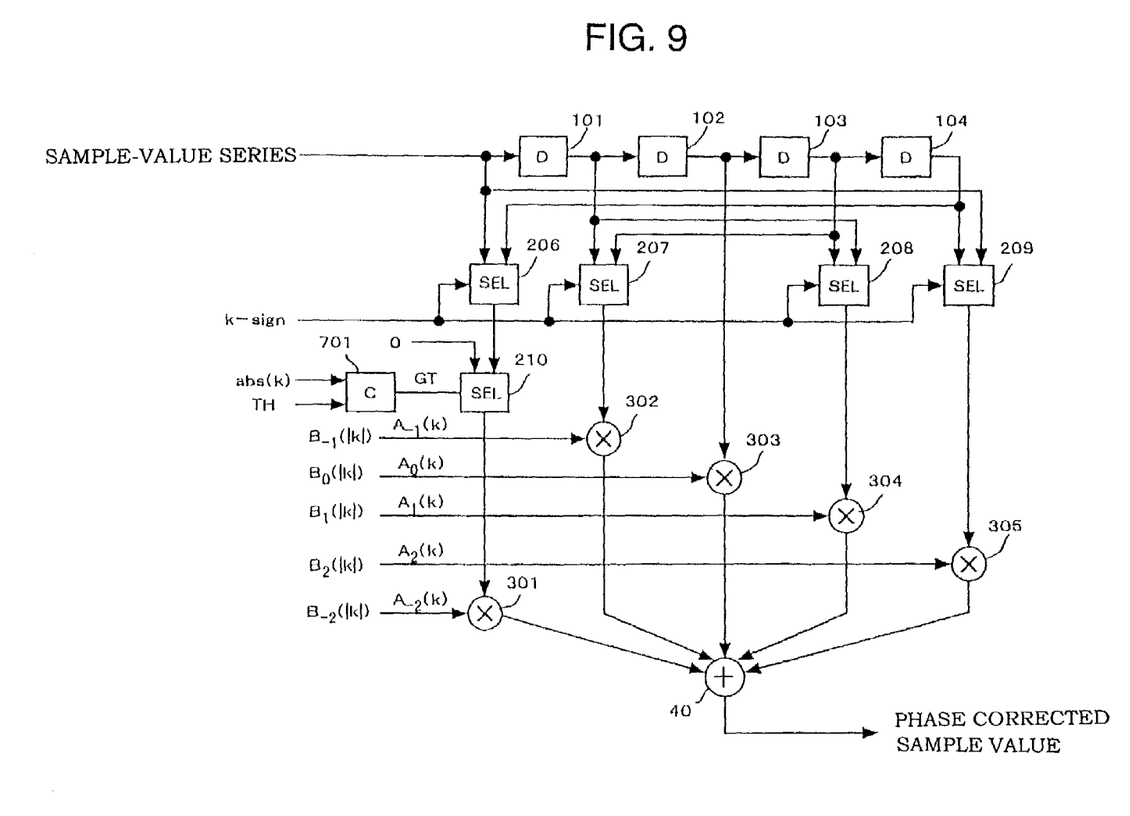
FIG. 9 is a block diagram showing the detailed construction of the phase-correction unit of a second example of changes to the embodiment of this invention.

FIG. 9 is a block diagram showing the detailed construction of the phase-correction unit 15 of this second example of change. The construction shown in FIG. 9, differs from the construction of the first example of change shown in FIG. 7, in that instead of the selectors 201 to 205, there are selectors 206 to 209 that are connected to the delay elements 101 to 104, and a selector 210 that is connected to the selector 206. The construction of the additional circuits of this second example of change is the same as that shown in FIG. 5.

The sample value before the delay and the sample value that is output from the delay element 104 are input to the selector 206 and selector 209 on both ends, respectively. Also, the sample value that is output from the delay element 101 and the sample value that is output from the delay element 103 are input to the center selectors 207 and 208, respectively. The sign k-sign of the phase error k is supplied to the selectors 206 to 209. Also, the output from the selector 206 and zero are input to the selector 210, and the connection is switched by the signal GT that is output from the comparator 701 described above.

Moreover, the five table values, $B_{-2}(abs(k))$, $B_{-1}(abs(k))$, $B_0(abs(k))$, $B_1(abs(k))$ and $B_2(abs(k))$ from the conversion table 60 are input directly as is to the multipliers 301 to 305 as tap coefficients $A_{-2}(k)$, $A_{-1}(k)$, $A_0(k)$, $A_1(k)$ and $A_2(k)$. Also, for the other input to the multipliers 301, 302, 304 and 305, the selectors 210, 207, 208 and 209 are connected in order, and for the other input to the center multiplier 303, the delay element 102 is connected directly.

In the construction described above, when abs(k) is less than the threshold value TH, and when the phase error k is positive, the inputs on the left side in FIG. 9 are selected for the connections of the selectors 206, 207, 208 and 209, respectively. Therefore the sample value before the delay, the sample value from the delay element 101, the sample value from the delay element 102, the sample value from the delay element 103 and the sample value from the delay element 104 are input in order to the multipliers 301 to 305. On the other hand, when the phase error k is negative, the inputs on the right side in FIG. 9 are selected for the connection of the selectors 206, 207, 208 and 209, respectively. Therefore, the sample value from the delay element 104, the sample value from the delay element 103, the sample value from the delay element 102, the sample value from the delay element 101 and the sample value before the delay are input in order to the multipliers 301 to 305.

When abs(k) is greater than the threshold value TH, zero is selected as the input for the selector 210, so zero is always input to the multiplier 301 when the phase error k is positive or negative. Therefore it is possible to set the tap coefficient for the sample value before the delay when the phase error k is positive, and the tap coefficient for the sample value from the delay element 104 when the phase error k is negative to zero. In other words, it is possible to set the tap coefficients for the tap positions furthest from the center tap to zero, and perform processing.

In this way, with the construction of this second example of change, it is possible to obtain the same function as in the first example of change described above. In the construction shown in FIG. 9, depending on whether the phase error k is positive or negative, the tap positions corresponding to the multipliers 301 to 305 are opposite of each other, so as a result the same operation as for the selectors 201 to 204 in FIG. 7 is possible. When the threshold value is set to zero, it is possible to omit the comparator 701 and the selector 210. Also, when k=0, $B_{-2}(abs(k))=0$, so it is also possible to omit the multiplier 301, and thus it is also possible to omit the selector 206, or in other words it is possible to obtain construction of a practical 4-tap transversal filter, and it is possible to simplify the entire construction.

Figure 10:
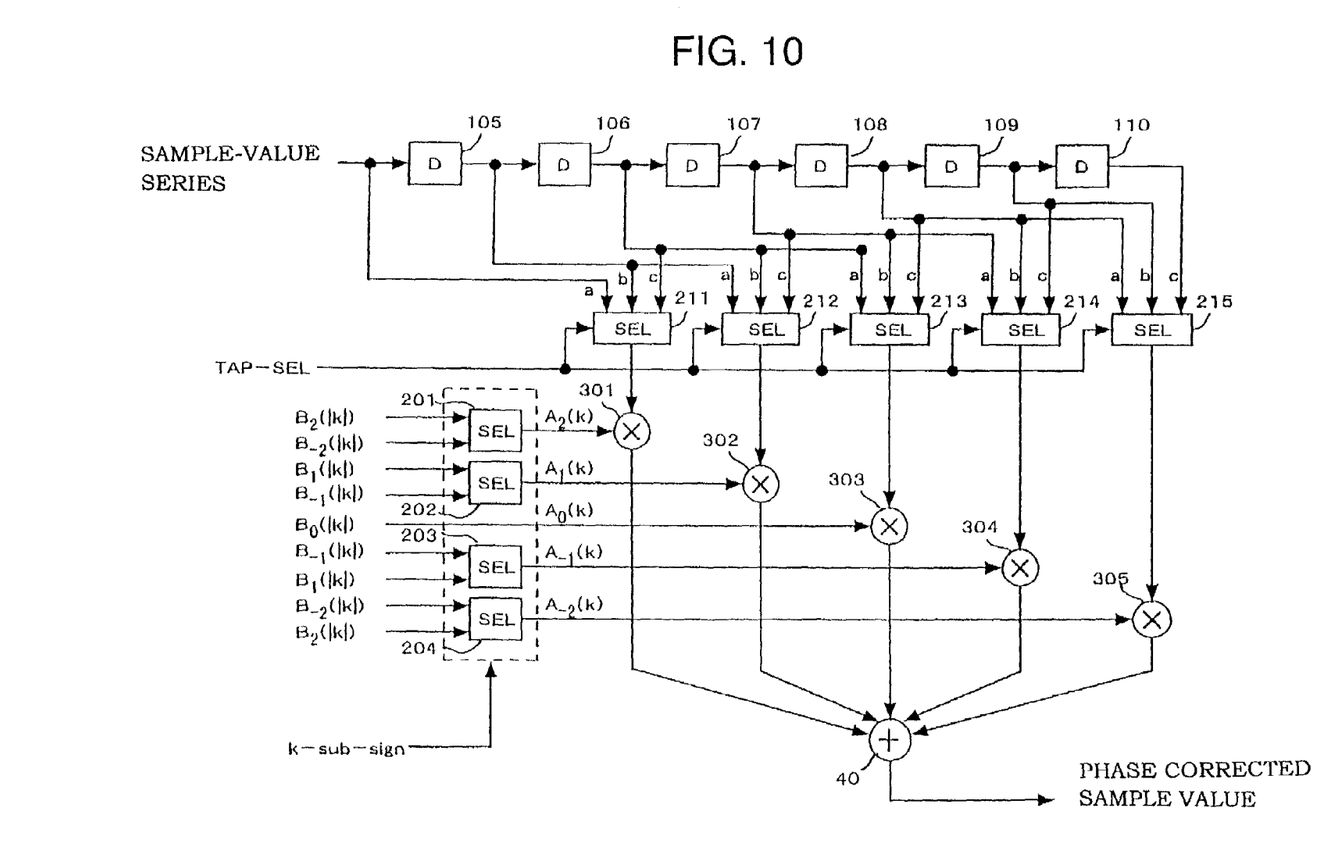
FIG. 10 is a block diagram showing the detailed construction of the phase-correction unit of a third example of changes to the embodiment of this invention.

Next, a third example of changes to the phase-correction unit 15 will be explained. FIG. 10 is a block diagram showing the detailed construction of the phase-correction unit 15 of this third example of change. As shown in FIG. 10, this third example of change differs from the construction shown in FIG. 4 in that there is a total of six delay elements 105 to 110, five selectors 211 to 215 that are connected to the delay elements 105 to 110, as well as there is a selection signal TAP-SEL for switching the connection of the selectors 205 to 214.

Figure 11:
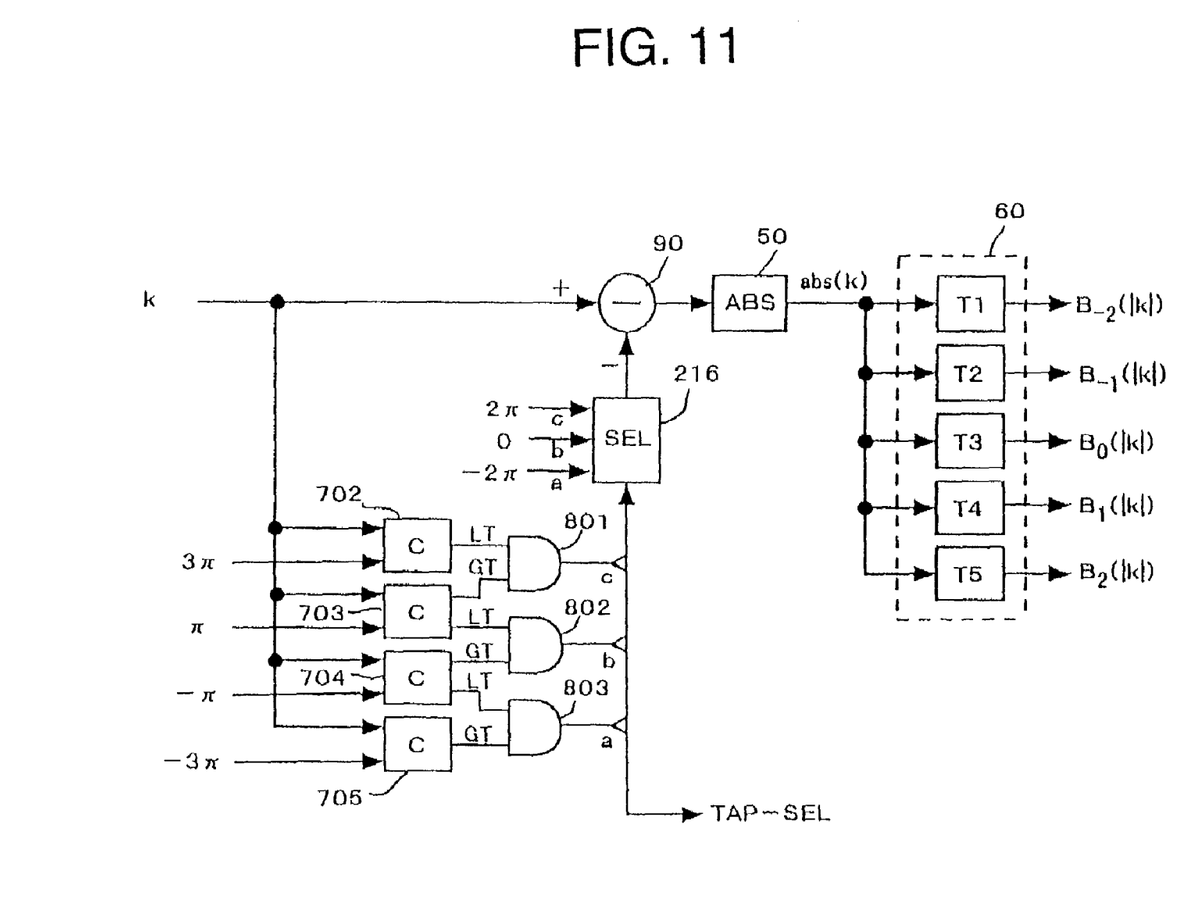
FIG. 11 is a block diagram showing the construction of an additional circuit that is added to the construction of the third example of changes.

Also, FIG. 11 is a block diagram showing the construction of the additional circuits of this third example of change. The additional circuits of this third example differs from the construction shown in FIG. 5 in that in addition to the absolute-value circuit 50 and the conversion table 60, there are comparators 702 to 705, AND circuits 801 to 803, a selector 216 and a subtractor 90.

This third example of change corresponds to the case of the input phase error k changing within a wider range (here this range is $-3\pi$ to $3\pi$). First, in the additional circuits shown n FIG. 11, the phase error k is input in each of the four comparators 702 to 705. Also, the threshold values ($3\pi$, $\pi$, $-\pi$, $-3\pi$) for the amount of phase error are set as other input for each of the comparators 702 to 705, respectively. In other words, $3\pi$ is input to the comparator 702, $\pi$ is input to the comparator 703, $-\pi$ is input to the comparator 704, and $-3\pi$ is input to the comparator 705, and each is compared with the phase error k to determine which is larger and smaller. When it is determined from the results of comparison by the comparators 702 to 705 that the phase error k is larger than the threshold value, the comparator outputs a signal GT, and when the phase error k is less than the threshold value, the comparator outputs a signal LT.

The signals GT, LT are input from the comparators to the AND circuits 801 to 803. That is, when the phase error k is within the range $\pi$ to $3\pi$, the signal LT is output from the comparator 702 and the signal GT is output from the comparator 703, so the AND circuit 801 becomes Hi-level (signal c). When the phase error k is in the range $-\pi$ to $\pi$, the signal LT is output from the comparator 703 and the signal GT is output from the comparator 704, so the AND circuit 802 becomes Hi-level (signal b). Also, when the phase error k is in the range $-3\pi$ to $-\pi$, the signal LT is output from the comparator 704 and the signal GT is output from the comparator 705, so the AND circuit 803 becomes Hi-level (signal a). On the other hand, when the phase error is greater than $3\pi$ or less than $-3\pi$, all of the AND circuits stay at Low-level.

The range $-3\pi$ to $3\pi$, of the phase error k is divided into three divisions in this way, and a, b or c is selectively output as the selection signal TAP-SEL shown in FIG. 11. This selection signal TAP-SEL is supplied to the selectors 211 to 215 shown in FIG. 10 and described later, and is also supplied to the selector 216 shown in FIG. 11.

On the other hand, the phase error k is input to the subtractor 90, and the subtractor 90 subtracts the output signal from the selector 216 and outputs the subtraction result k-sub. Three fixed values, $2\pi$, 0 and $-2\pi$, are input to the selector 216 and the connection is switched according to the selection signal TAP-SEL. In other words, when TAP-SEL=a, $-2\pi$ is output from the selector 216, TAP-SEL=b, 0 is output from the selector 216, and when TAP-SEL=c, $2\pi$ is output from the selector 216.

Therefore, in the subtractor 90, when the phase error k is in the range $-3\pi$ to $-\pi$, $2\pi$ is added ($-2\pi$ is subtracted), when the phase error k is in the range $-\pi$ to $\pi$, no subtraction is performed, and when the phase error k is in the range $\pi$ to $3\pi$, $2\pi$ is subtracted. In other words, within the range $-3\pi$ to $3\pi$, the range of the input phase error k is taken to be $-\pi$ to $\pi$, and processing after this in the absolute-value circuit 50 and conversion table 60 are the same as that in FIG. 5.

Next, in FIG. 10, three adjacent sample values from the tap configuration of sample-value series comprising the delay elements 105 to 110 are input to each of the five selectors 211 to 215. For example, the sample value before the delay, the sample value from the delay element 105 that is delayed by one block, and the sample value from the delay element 106 that is delayed by two blocks is input to the first selector 211. Similarly, selectors 212, 213, 214 and 215 are configured such that three sample values are input to each selector and that the values are in order being shifted by one block each.

Each of the selectors 211 to 215 is controlled such that they switch the connections based on the selection signal TAP-SEL. As shown in FIG. 10, when TAP-SEL=a, the left sample values are selected, when TAP-SEL=b, the center sample values are selected and when TAP-SEL=c, the right sample values are selected. In other words, when the range of the phase error k is $-3\pi$ to $-\pi$, the connections for selectors 211 to 215 have a 5-tap configuration from the sample value before the delay to the sample value from the delay element 108. When the range of the phase error k is $-\pi$ to $\pi$, the connections for selectors 211 to 215 have a 5-tap configuration of the sample values from delay elements 105 to 109. Moreover, when the range of the phase error k is π to 3π, the connections for selectors 211 to 215 have a 5-tap configuration of the sample values from delay elements 106 to 110.

Therefore, the input of the five multipliers 301 to 305 becomes the sample values having a 5-tap configuration that is shifted based on the selection signal TAP-SEL. That is, in the transversal filter having a 7-tap configuration comprising the delay elements 105 to 110, a 5-tap configuration of adjacent taps is selected that corresponds to the phase error k.

Figure 12:
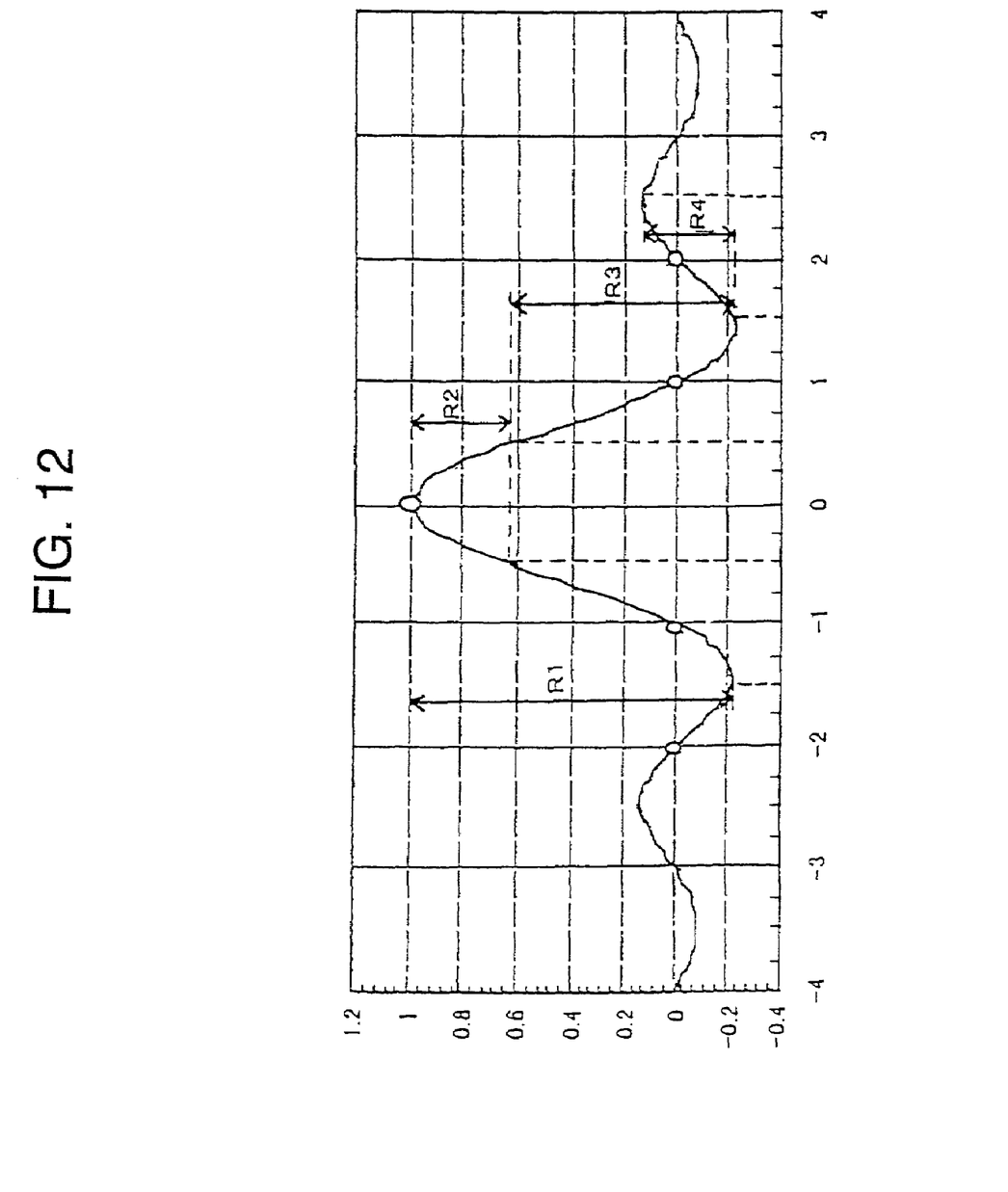
FIG. 12 is a drawing that explains the range of tap coefficients.

As shown in FIG. 12, in the case of a phase-correction unit 15 which does not use the aforementioned selection signal TAP-SEL and in which there are no selectors 211 to 215, it is necessary for each of the tap coefficients $A_2(k)$ to $A_{-2}(k)$ to include the range R1. However, with construction such as shown in FIG. 10 and FIG. 11, it is possible for the tap coefficient $A_0(k)$ to include the range R2, for the tap coefficients $A_1$ and $A_{-1}$ to include range R3, and for tap coefficients $A_2$ and $A_{-2}$ to include the range R4. In this way it is possible to express each of the tap coefficients $A_2(k)$ to $A_{-2}(k)$ with more precision even when they are expressed with the same resolution (number of bits). Also, when expressing the tap coefficients with resolution that corresponds to range R1, it is possible to reduce the number of bits by using ranges R2, R3 and R4, and thus it is possible to reduce the size of the phase-correction unit 15.

In the embodiment of this invention and the examples of changes that were described above using FIG. 1 to FIG. 12, the basic effect is the same for each case. In other words, the features of this invention are the second PLL comprising a phase-correction unit 15 and phase-detection unit 16, and a first PLL comprising the second PLL and a delay element 14 consisting of a clock generator 12. With the aforementioned features, it is possible to obtain a stable PLL with good followability for generating a clock for synchronizing the phase of a sample-value series in a data reproduction apparatus as described above.

In the embodiments described above, the transversal file of the phase-correction unit 15 is constructed such that it uses a conversion table 60 for referencing tap coefficients, however instead of the conversion table 60, it is possible to output tap coefficients by combining circuits such as multipliers, adders, and subtractors. Also, for the phase-correction unit 15, a type of transversal filter that uses a plurality of multipliers that are connected to the taps for performing the filtering operation, however, it is also possible to use a type of transversal filter that uses a plurality of adders and subtractors that are connected to the taps for performing the filtering operation.

Also, in the embodiment described above, construction was explained in which the filtering operation is performed by the phase-correction unit 15 using a transversal filter having a plurality of taps, and the zero-cross of the sample-value series is detected by the phase-detection unit 16, however, the invention is not limited to this, and it is possible to apply the invention to other construction where a second PLL, having a phase-correction unit and phase-detection unit, is used in addition to a first PLL.

The entire disclosure of Japanese Patent Application No. 2001-17534 filed on Jan. 25, 2001 including the specification, claims, drawings and summary is incorporated herein by reference in its entirety.

What is claimed is:

1. A data-reproduction apparatus for reproducing digital data based on a reproduction signal that is read from a recording medium, the data-reproduction apparatus comprising:
    a conversion device for sampling said reproduction signal according to a sampling clock and converting the said reproduction signal to a sample-value series;
    a phase-correction device for correcting phases of said sample-value series according to a phase-error signal;
    a phase-detection device for detecting said sample-value series whose phase has been corrected by the phase-correction device and for generating the phase-error signal; and
    a clock generation device for generating said sampling clock for synchronizing said sample-value series according to said phase-error signal.

2. The data-reproduction apparatus according to claim 1, wherein said phase-correction device is provided with a transversal filter having a plurality of taps.

3. The data-reproduction apparatus according to claim 2, wherein said transversal filter uses a transfer function that is symmetrical around the center position for performing the filtering operation, and sets tap coefficients according to said phase-error signal.

4. The data-reproduction apparatus according to claim 2, wherein said transversal filter uses a transfer function that is symmetrical around the center position for performing the filtering operation, and selectively switches the connection of said plurality of taps according to said phase-error signal.

5. The data-reproduction apparatus according to claim 2, wherein said transversal filter selectively sets taps coefficients at tap positions that are symmetrical around a center tap according to the polarity of the phase-error signal.

6. The data-reproduction apparatus according to claim 2, wherein there is a conversion table containing table values that correspond to tap coefficients and wherein said transversal filter sets tap coefficients for each tap position by referencing that conversion table.

7. The data-reproduction apparatus according to claim 2, wherein said transversal filter sets the tap coefficients to zero for the tap positions that are furthest away from said center tap position when the absolute value of said phase-error signal is greater than a specified threshold value.

8. The data-reproduction apparatus according to claim 2, wherein said phase-error signal changes in a range that exceeds one cycle of said clock, and where said transversal filter selectively switches the connection of said plurality of taps according to the change in said phase-error signal.

9. The data-reproduction apparatus according to claim 8, wherein said transversal filter has n taps, and selectively connects m adjacent taps (m<n) according to the change in said phase-error signal.

10. The data-reproduction apparatus according to claim 1, wherein said phase-detection device is provided with a zero-cross-detection device of detecting the zero-cross of said sample-value series.

* * * * *